United States Patent [19]

Smith

[11] 4,409,494

[45] Oct. 11, 1983

[54] RESET CIRCUIT FOR DATA LATCHES

[75] Inventor: Gregory J. Smith, Chandler, Ariz.

[73] Assignee: Motorola, Inc., Schaumburg, Ill.

[21] Appl. No.: 341,049

[22] Filed: Jan. 21, 1982

[51] Int. Cl.³ .................... H03K 17/20; H03K 17/62
[52] U.S. Cl. ................................ 307/238.3; 307/291; 307/547; 340/347 DA
[58] Field of Search ................ 307/475, DIG. 1, 547, 307/557, 289, 291, 238.3, 238.6, 455; 340/347 DA

[56] References Cited

U.S. PATENT DOCUMENTS 3,893,190  7/1975  Robbins ........................... 307/238.3
3,902,079  8/1975  Ahmed ............................ 307/289 X
4,237,387  12/1980  Devendorf et al. ............ 307/289 X
4,292,625  9/1981  Schoeff ........................ 340/347 DA Primary Examiner—Stanley D. Miller
Assistant Examiner—David R. Hudspeth
Attorney, Agent, or Firm—William E. Koch

[57] ABSTRACT

A reset circuit for resetting one or more data latches of a digital-to-analog converter includes an output transistor for sinking current from the latches. An input transistor is biased by a high-low input enabling one of a differential pair of transistors that drive the output transistor. The current used to drive the output transistor is clamped by a clamping transistor.

9 Claims, 1 Drawing Figure

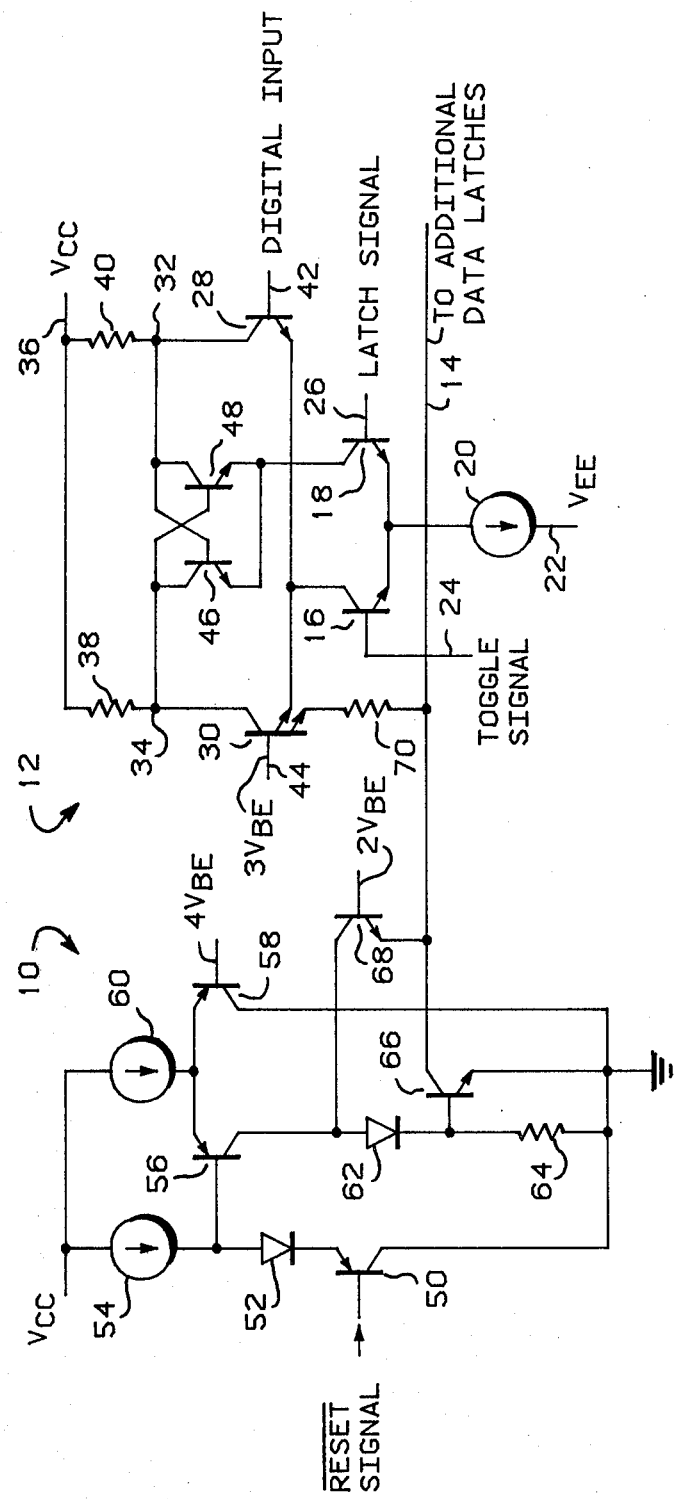

RESET CIRCUIT FOR DATA LATCHES

BACKGROUND OF THE INVENTION

1. Field of the Invention

This invention relates, in general, to reset circuits and more particularly to a reset circuit for data latches of a digital to analog converter.

2. Background Art

Digital to analog converters implemented with bipolar transistors typically have a plurality of differential transistor pairs functioning as switches. Digital input signals representative of a binary number determine the on-off state of each switch wherein the on state of each switch supplies a binary scaled bit current to a summing bus to form an analog signal corresponding to the digital input signal.

A typical switch, wherein the output may be latched, includes a first differential transistor pair biased by a digital input signal and an inverse digital input signal, a second differential transistor pair that are cross-coupled and are responsive to the output of the first pair, a third differential transistor pair responsive to the output of the first and second pair for directing an output current onto a summing bus, and a fourth differential transistor pair responsive to toggle and latch signals for enabling either the first or second pair. In order to reset the latch, a transistor is provided that diverts current to ground from the base of one of the cross-coupled pair that is biased on. As the voltage is pulled down below the voltage at the base of the other one of the cross-coupled pair, the cross-coupled pair invert their on-off state, thus, resetting the latchable switch. However this configuration consumes an undesirable amount of power in the reset mode and is difficult to match logic thresholds. Furthermore, the capacitive loading adds imbalance and the reset circuit is fast only if voltage driven.

Another known configuration for the reset portion of the switch has the transistor diverting the current to the collector of the fourth differential pair. However, as in the prior configuration, capacitive loading adds imbalance and it is difficult to match logic thresholds in all applications. Furthermore, this configuration requires hard saturation of the reset transistor.

Thus, what is needed is a reset circuit for data latches that has good speed, matched logic thresholds, low power consumption, and does not add imbalance to the latch.

SUMMARY OF THE INVENTION

Accordingly, it is an object of the present invention to provide an improved reset circuit for data latches.

Another object of this invention is to provide a reset circuit having matched logic thresholds with a data latch.

A further object of this invention is to provide a reset circuit for data latches having low power consumption in the reset mode.

A further object of this invention is to provide a reset circuit for a data latch that does not add imbalance to the latch.

In carrying out the above and other objects of the invention in one form, there is provided an improved reset circuit useful with data latches of a digital to analog converter. An output switching device is coupled to the data latch for sinking current from a node controlling the latched position of the data latch. A means for biasing the output switching device includes an input switching device responsive to an input having high and low states, and a differential pair of switching devices coupled to the input switching device and the output switching device.

The above and other objects, features, and advantages of the present invention will be better understood from the following detailed description taken in conjunction with the accompanying drawing.

BRIEF DESCRIPTION OF THE DRAWINGS

The single FIGURE is a schematic of the preferred embodiment of the invention.

DETAILED DESCRIPTION OF THE INVENTION

Referring to the single FIGURE, a reset circuit 10 in accordance with this invention is coupled to a data latch 12 and additional latches via conductor 14. The reset circuit 10 may be used to reset any type of latch circuit and is not to be restricted to the data latch 12 as shown. The data latch 12 includes a mode controlled differential pair comprising emitter-coupled NPN transistors 16 and 18. A latch current source 20 is coupled between a negative voltage $V_{EE}$ via first $V_{EE}$ conductor 22 and the emitters of transistors 16 and 18. The negative voltage $V_{EE}$ may alternatively be ground. The bases of transistors 16 and 18 are connected to toggle signal conductor 24 and latch signal conductor 26, respectively. Since the toggle signal and latch signal are complementary, only one of the transistors 16 and 18 will be conducting current from the remainder of latch circuit 12 at a given time.

The collector of transistor 16 is connected to the coupled emitter of data input differential pair transistors 28 and 30. The collectors of transistors 28 and 30 are connected to nodes 32 and 34, respectively, and nodes 32 and 34 are coupled to $V_{CC}$ conductor 36 by resistors 40 and 38 respectively. Digital input conductor 42 and threshold voltage conductor 44 are connected to the bases of transistors 28 and 30, respectively, whereby the digital input signal relative to the threshold signal determines the differential voltage at nodes 32 and 34 when a toggle signal is being received by transistor 16.

The collector of transistor 18 is connected to the coupled emitters of cross-coupled differential pair transistors 46 and 48. The base and collector of transistor 46 are connected to nodes 32 and 34, respectively, while the base and collector of transistor 48 are connected to nodes 34 and 32, respectively.

In operation, a bias voltage ($V_{CC}$) is applied at conductor 36 which provides a voltage potential at nodes 32 and 34. A toggle signal at the base of transistor 16 causes transistor 16 to conduct current from node 32 when a "high" bit input turns on transistor 28. When a low bit input turns off transistor 28, transistor 30 turns on, lowering the voltage at node 34 and increasing the voltage at node 32.

A latch signal at the base of transistor 18 turns transistor 18 on enabling a current path from node 32 or 34 depending on which node had current flowing through it when the latch signal was received. For example, if the current path comprised resistor 40, transistor 28 and transistor 16 when the latch signal was received, node 34 was high. Therefore, transistor 48 is biased on, diverting the current along the path comprising resistor 40, transistor 48 and transistor 18, whereby the current is unaffected by the digital input.

The reset circuit 10 includes a PNP transistor 50 having a base responsive to an active low reset signal, a collector connected to ground (a bias voltage which alternately may be $V_{EE}$), and an emitter connected to the cathode of diode 52. The anode of diode 52 is coupled to the bias voltage $V_{CC}$ by first current source 54 and connected to the base of transistor 56. PNP transistors 56 and 58 comprise a differential pair, having their emitters coupled to $V_{CC}$ by a second current source 60. The base and collector of transistor 58 are connected to a threshold voltage of four $V_{BE}$ and ground respectively. The collector of transistor 56 is connected to the anode of diode 62, the cathode thereof being coupled to ground by resistor 64. The cathode of diode 62 is also connected to the base of transistor 66. Diodes 52 and 62 are included in the circuit as voltage drops for setting threshold levels. The emitter of transistor 66 is connected to ground and the collector thereof is connected to conductor 14. Transistor 68 has a collector connected to the collector of transistor 56 and the emitter of transistor 68 is connected to conductor 14. The base of transistor 68 is responsive to a threshold voltage of two $V_{BE}$.

Conductor 14 is coupled to each latch circuit 12 by a resistor 70. The resistor 70 is connected to a second emitter of transistor 30. Transistor 30 is shown as a dual emitter NPN transistor, however in the alternative may be two separate transistors in parallel, both having their collectors connected to node 34 and their bases connected to conductor 44. Furthermore, the illustrated NPN transistors may be PNP transistors and the illustrated PNP transistors may be NPN transistors if the polarity of the voltage and current sources are likewise reversed. Also, NMOS and PMOS transistors may be substituted for the NPN and PNP transistors if the bias voltages are modified accordingly.

A reset function is accomplished when the reset signal goes low. Current is steered into resistor 64 whenever the reset signal is below the TTL threshold of two $V_{BE}$. A reset signal below two $V_{BE}$ causes the base of transistor 56 to go below the four $V_{BE}$ threshold as determined by the other differential pair transistor 58, thereby turning transistor 56 on and supplying current to resistor 64. The value of resistor 64 and the current of current source 60 should be such that their product exceeds one $V_{BE}$ of voltage drop across resistor 64 when not clamped by the base-emitter junction of transistor 66. The excess current beyond this criteria is available as base drive to transistor 66 and should be of a magnitude that when multiplied by the current gain of transistor 66, the reset current requirements of the data latch 12 are met. Transistor 66 will sink current from transistor 30 of all the latch circuits 12. Therefore, when a digital input signal is latched and node 34 is high compared to node 32, a reset signal will invert the state of the cross-coupled differential pair transistors 46 and 48. The collector of transistor 66 is clamped at one $V_{BE}$ by transistor 68 and therefore the resetting current is predictable from the value of resistor 70 and the voltage drop of one $V_{BE}$ across resistor 70.

Transistor 68 removes any extra base drive current for transistor 66 from the driving current of transistor 56 that turns on transistor 66. This loop limits the collector current in transistor 66 to only the amount necessary to develop one $V_{BE}$ across resistor 70 independent of the base drive to transistor 66. Transistor 66 conducts only during the active reset mode and with a minimum of wasted current. The power dissipation is limited primarily by the value of resistor 70. The component of differential voltage at nodes 32 and 34 that is generated by the active reset circuit 10 is equal to the value of resistor 38 divided by the value of resistor 70 multiplied by one $V_{BE}$. This component of voltage must exceed the component of differential voltage generated by current source 20 and resistor 40 in order to guarantee successful reset operation. If the current of current source 20 is derived from a resistor that tracks resistors 40, 38, and 70 over temperature and processing, then the proper operation of resetting is dependent on only the ratio values of those resistors. The sum of the magnitudes of the above mentioned components of differential voltages at nodes 32 and 34 should not exceed the available collector to base voltage for transistor 30 if it is desired that transistor 30 never saturate. It is this condition or the voltage compliance requirements of current source 60 in addition to the base-emitter bias voltage of transistor 58 that limits the minimum $V_{CC}$ potential. Otherwise, the fundamental operation of reset circuit 10 and latch circuit 12 are voltage supply independent.

The only modification necessary to change the operation of the reset circuit 10 from the active low input to active high input is to reverse the connections of the collectors of transistors 56 and 58.

By now it should be appreciated that there has been provided an improved reset circuit useful with data latches. This reset circuit does not add imbalance to the data latch and has matched logic thresholds along with a relatively high operating speed. The reset circuit is biased in a manner to result in low power consumption.

I claim:

1. A reset circuit having an input terminal and an output terminal, said input terminal responsive to a reset signal having first and second states, comprising:
    a first NPN transistor having a collector coupled to said output terminal and an emitter coupled to a first bias voltage, for sinking current from said output terminal;
    means coupled to said input terminal and a base of said first NPN transistor for biasing said first NPN transistor when said reset signal is in said first state; and
    a second NPN transistor for limiting current from said output terminal, said second NPN transistor having an emitter coupled to said output terminal, a base coupled to said first threshold voltage, and a collector coupled to said means.

2. A reset circuit according to claim 1 wherein said means comprises:
    an input switching device responsive to said reset signal and having an output; and
    a differential pair of switching devices coupled to said input switching device and the base of said output switching device and responsive to a second threshold voltage and said output of said input switching device.

3. A reset circuit according to claim 2 wherein said input switching device comprises a first PNP transistor having a base coupled to said input terminal, a collector coupled to the first bias voltage, and an emitter coupled to said differential pair of switching devices.

4. A reset circuit according to claim 3 wherein said differential pair of switching devices comprises:
    a second PNP transistor having a base coupled to the emitter of said first PNP transistor, a collector coupled to the base of said output switching device, and an emitter coupled to a second bias voltage; and a third PNP transistor having a base coupled to a second threshold voltage, a collector coupled to the first bias voltage, and an emitter coupled to said second bias voltage.

5. A reset circuit responsive to an input having high and low states for resetting one or more data latches having latchable first and second states, by sinking current from a node that determines said first and second states, said reset circuit comprising:

a first NPN transistor having a collector coupled to said node and an emitter coupled to a first bias voltage, for sinking current from said node;

means coupled to said input and a base of said first NPN transistor for biasing said first NPN transistor when said input is in one of said states; and a second NPN transistor for limiting the current from said node, said second NPN transistor having an emitter coupled to said node, a base coupled to a first bias voltage, and a collector coupled to said means.

6. A reset circuit according to claim 5 wherein said means comprises:

an input switching device responsive to said input and having an output; and a differential pair of switching devices coupled to said input switching device and the base of said output switching device and responsive to a second threshold voltage and said output of said input switching device.

7. A reset circuit according to claim 6 wherein said input switching device comprises a first PNP transistor having a base coupled to said input, a collector coupled to the first bias voltage, and an emitter coupled to said differential pair of switching devices.

8. A reset circuit according to claim 7 wherein said differential pair of switching devices comprises:

a second PNP transistor having a base coupled to the emitter of said first PNP transistor, a collector coupled to the base of said output switching device, and an emitter coupled to a second bias voltage; and a third PNP transistor having a base coupled to a second threshold voltage, a collector coupled to the first bias voltage, and an emitter coupled to said second bias voltage.

9. A reset circuit responsive to a reset input having high and low states for resetting one or more data latches having latchable first and second states, said data latches including a data input differential pair of switching devices responsive to a threshold voltage and a digital input signal wherein said digital input signal has a first and a second state, a cross-coupled differential pair of switching devices responsive to the output of said data input differential pair of switching devices, and a means for steering a current generated by a current source to said data input differential pair of switching devices when receiving a toggle signal and to said cross-coupled differential pair of switching devices when receiving a latch signal, said reset circuit comprising:

an output switching device coupled to said cross-coupled differential pair of switching devices for sinking current from one of said cross-coupled differential pair of switching devices;

means for limiting current from one of said cross-coupled differential pair of switching devices;

an input switching device responsive to said reset input and having an output; and a differential pair of switching devices coupled to said input switching device and said output switching device and responsive to said output of said input switching device.

* * * * *